(12) United States Patent
Brady et al.

(10) Patent No.: US 6,800,255 B2
(45) Date of Patent: Oct. 5, 2004

(54) SYSTEM AND METHOD FOR THE ABATEMENT OF TOXIC CONSTITUENTS OF EFFLUENT GASES

(75) Inventors: David Charles Brady, Windermere, FL (US); Steven M. Browne, Orlando, FL (US); James L. Flack, Oviedo, FL (US); Mark K. Mitchell, Winter Park, FL (US)

(73) Assignee: Agere Systems, Inc., Allentown, PA (US)

( * ) Notice: Subject to any disclaimer, the term of this patent is extended or adjusted under 35 U.S.C. 154(b) by 91 days.

(21) Appl. No.: 10/055,583

(22) Filed: Jan. 23, 2002

(65) Prior Publication Data

US 2003/0138367 A1 Jul. 24, 2003

(51) Int. Cl.[7] .......................... B01D 53/34; B01D 47/00
(52) U.S. Cl. ........................ 422/171; 422/170; 422/173
(58) Field of Search .................................. 422/168–173

(56) References Cited

U.S. PATENT DOCUMENTS

| | | | | |
|---|---|---|---|---|
| 4,519,999 A | * | 5/1985 | Coleman et al. | 423/337 |
| 4,719,088 A | * | 1/1988 | Itoh et al. | 422/106 |
| 4,886,444 A | | 12/1989 | Hirase et al. | |
| 5,536,298 A | | 7/1996 | Awaji | |
| 5,716,428 A | * | 2/1998 | Imamura | 95/225 |
| 6,051,197 A | | 4/2000 | Park | |
| 6,126,906 A | * | 10/2000 | Imamura | 422/170 |
| 6,140,130 A | * | 10/2000 | Salmen et al. | 436/55 |
| 6,346,195 B1 | * | 2/2002 | Filson et al. | 210/668 |

* cited by examiner

Primary Examiner—Hien Tran

(57) ABSTRACT

An abatement system and method for the abatement of contaminants of effluent gases produced during the manufacture of semiconductor devices. A burn/wet scrubber is provided at the device fabrication site where toxic effluent gases are produced. The burn/wet scrubber oxidizes and condenses toxic compounds. Wastewater used to condense oxidized toxic gases is treated locally in an ion exchange filter. The treated wastewater is then directed to a centralized wastewater treatment facility.

6 Claims, 2 Drawing Sheets

SYSTEM AND METHOD FOR THE ABATEMENT OF TOXIC CONSTITUENTS OF EFFLUENT GASES

This invention relates to the treatment of effluent gases produced during the manufacturing of semiconductor devices and, more specifically, to the treatment of water used in the abatement of toxic constituents of effluent gases produced from chemical vapor deposition fabrication steps in the manufacture of semiconductor devices.

BACKGROUND OF THE INVENTION

The manufacture of semiconductor devices produces a variety of waste products including some products, which in some concentrations, may be considered as toxic. For example, chemical vapor deposition (CVD) processes may produce toxic effluent gases. During the CVD process, a carrier gas transports gaseous reactants into a reaction chamber in which a semiconductor device is supported. The reactants impinge on the semiconductor device surface and may undergo chemical reactions forming desired films on the device surface. Gaseous by-products, or effluent gases produced by such reactions are exhausted from the reaction chamber with the carrier gas.

The effluent gases are treated to remove any toxic gases, or to reduce the concentration of such toxic gases to acceptable levels. One form of a system for treating gases is shown in FIG. 1 as an abatement system 17 and includes a dry filter system 12 that abates the toxic gases through passive dry bed chemisorption. An exemplary filter system is manufactured by CS Clean Systems under their model designation CS125DC. In the system of FIG. 1, reactants are introduced into a CVD reactor 10 in which chemical reactions take place to form films on a semiconductor device. The carrier and effluent gases are exhausted from the reactor 10 through an outtake line 14 to a pump 11. The gases are then directed to the dry filter system 12 where the gases are treated and exhausted via line 16 into the environment with any toxic waste gases being reduced to acceptable concentration levels.

The dry filter bed abatement system of FIG. 1 requires frequent replacement of filters to ensure effective gas treatment. Not only does this require special handling in the disposal of used filter material, but the current costs of replacement material represents a substantial investment. Further, the system generally has a finite life cycle requiring periodic capital investment for replacement.

Another method used to treat effluent gases includes passing the effluent gases through an abatement system including what is known as a "burn/wet" scrubber. The effluent gases are first heated in a tower, and reactants are injected into the tower in order to oxidize some of the contaminants in the effluent gases. The oxidized contaminants are then passed through a rinse column and condensed by the application of rinse water. Residual gases are exhausted into the air while the rinse water, which is directed to a central water treatment facility, draws solid particulates from the system.

Newly developed silicon germanium CVD process may produce by-products containing such wastes as arsine and germanium that create further disposal problems. When burn/wet scrubbers are used to reduce arsine and germanium concentration in the effluent discharge, the rinse water, or wastewater, used to condense the toxic compounds or constituents flows to a central water treatment facility. Thus, the central wastewater facility becomes contaminated with arsenic and germanium. The central wastewater treatment facilities are not presently equipped to treat wastewater for abatement of arsenic and germanium by-products to generally accepted concentration levels.

SUMMARY OF THE INVENTION

The present invention for an abatement system incorporates a "burn/wet" scrubbing unit with a localized water treatment unit. The water treatment unit preferably utilizes an ion exchange filter in order to abate the concentration levels of toxic compounds, such as arsine and germanium compounds. The term abate, as used in this disclosure, is synonymous with and is used interchangeably with the term reduced.

A semiconductor device manufacturing facility typically utilizes a plurality of CVD reactors that produce effluent gases. In addition, other fabrication steps, such as plasma etching, oxidation, sputtering and reactive ion etching, may also produce undesirable effluents throughout the manufacturing facility. A wet/burn scrubber may be disposed between each of the CVD reaction chambers or other effluent gas sources and the central wastewater facility of the plant.

Effluent gas produced from the semiconductor device fabrication step is directed to the burn/wet scrubber. Some of the waste compounds are oxidized during a heating phase in the burn/wet scrubber. The oxidized compounds are condensed and separated from residual gases, which are exhausted into the air.

Water, referred to as rinse water or wastewater, used in the burn/wet scrubber to condense effluent gases, carries condensed toxic gases through the ion exchange filter, reducing undesirable constituents to acceptable concentrations. The treated wastewater is then directed to the central water treatment facility of the manufacturing plant. The use of the burn/wet scrubber avoids the cost of the dry filter systems of the prior art, and the localized treatment of the water eliminates contamination of the central wastewater treatment facility.

DETAILED DESCRIPTION OF THE DRAWINGS

Figure 1:
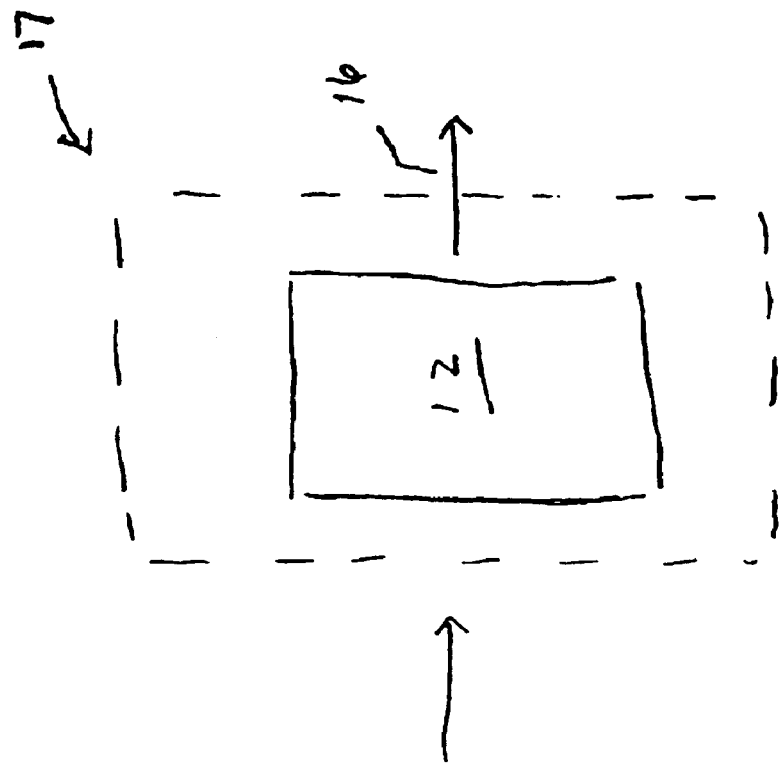
FIG. 1 is a schematic of a prior art abatement system.
Figure 2:
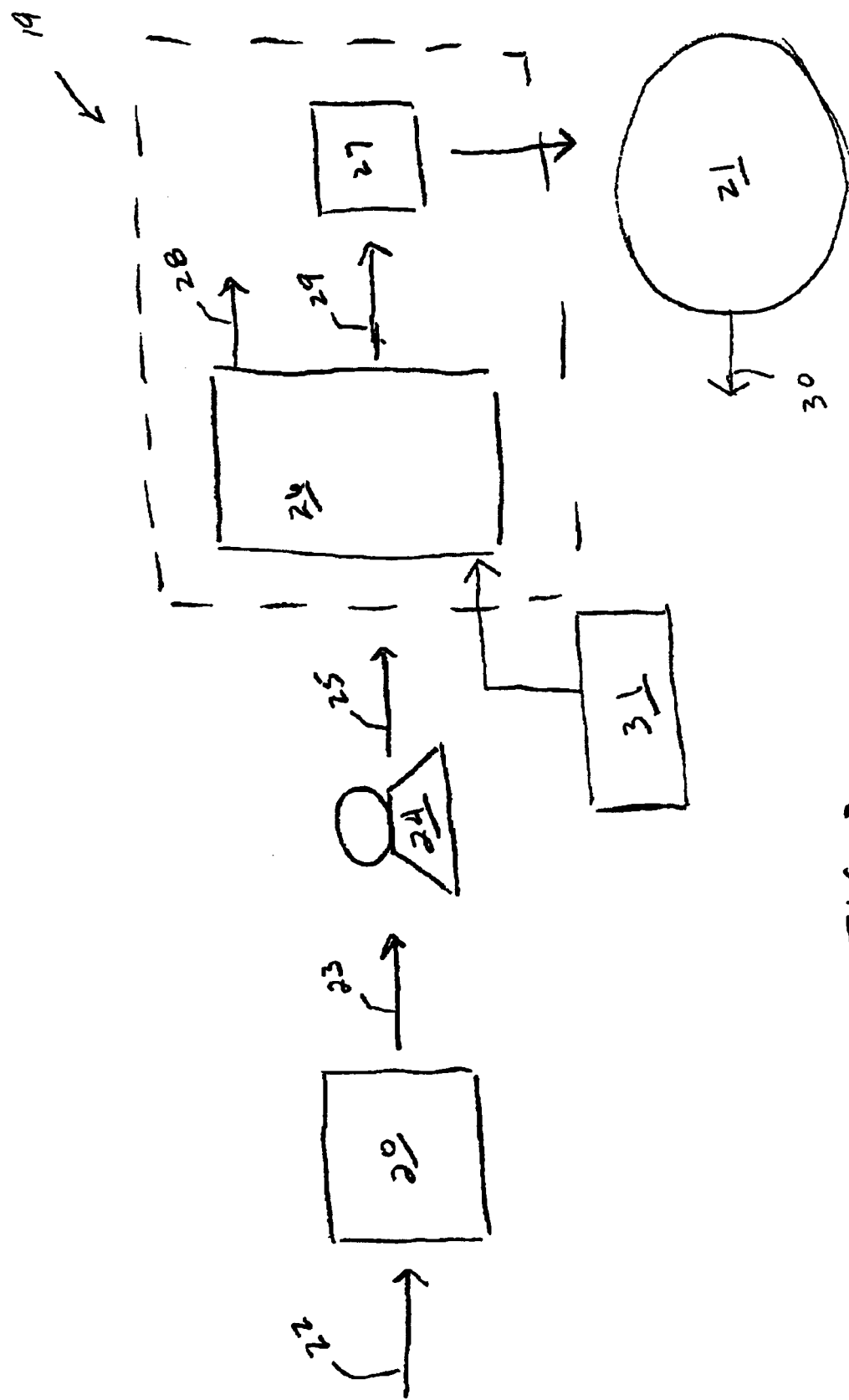
FIG. 2 is a schematic of the present invention for an abatement system with localized water treatment.

The present invention disclosed herein, for a system and method for the abatement of effluent gases in the manufacture of semiconductor devices, is illustrated in FIG. 2 of the drawings. FIG. 2 shows one embodiment of the invention in the context of the abatement of toxic constituents from effluent gases produced from chemical vapor deposition ("CVD"). However, the present invention is not limited by a specific fabrication step but may used in a variety of fabrication steps, such as plasma etching, oxidation, sputtering and reactive ion etching, that require the abatement of toxic constituents from effluent gases. With respect to FIG. 2, an abatement system 19 is shown disposed between a CVD reactor 20 and a water treatment facility 21 in a semiconductor device manufacturing plant. The schematic illustrates the flow direction of by-products produced from the CVD fabrication step in the manufacture of semiconductor devices. The water treatment facility 21 is a conventional, centralized facility of a type known for use in treating water at many semiconductor manufacturing plants.

Water used in various manufacturing steps, including filtration or abatement systems, is directed to the water treatment facility 21, where the water is treated, circulated for use in the plant, or emptied into the environment with acceptable concentration levels of toxic compounds via line or lines 30.

Intake line 22 represents the injection of reactants in gaseous form into the CVD reactor 20 in which the chemical vapor deposition of films on a semiconductor device takes place. Outtake line 23 directs the effluent gases, including CVD process gases and gas by-products, to a pump 24. The effluent gases contain different toxic gases produced in the CVD process such as arsine, silane, germanium hydride, dichorosilane and hydrochloric acid.

The pump 24 directs the effluent gases through line 25 to the abatement system 19. The abatement system 19 includes a gas treatment system commonly known as a burn/wet scrubber 26. The burn/wet scrubber 26 typically includes an oxidation column and a scrubbing column. An acceptable scrubber 26 that operates within the present invention is the CDO 863 model manufactured by ATMI, Inc., located in Danbury, Conn. Some of the compounds comprising the effluent gas are oxidized in the oxidation column by injection of an oxidizing agent and application of heat. Rinse water from a water source 31 is injected into the scrubber 26 to facilitate the condensation in the scrubbing column, and any residual gases are exhausted from the scrubber 26 through line 28. The condensed compounds, including the compounds having arsenic and germanium, are released from the scrubber 26 via water flow used in the condensation of the oxidized effluent gases through line 29, to a water filtration unit 27.

A localized water treatment unit 27 is disposed between the scrubber 26 and the water treatment facility 21. An ion exchange filter is preferably used in the water treatment unit 27 to filter the wastewater. U.S. Filter Recovery Services, Inc., located in Roseville, Minn., produces an acceptable ion exchange filter for use in the present invention and in at least one embodiment has been shown to reduce the concentration of the toxic compounds to less than 50 ppb. The size of the filter may vary according to the amount of wastewater processed and may be used to filter as little as a few gallons per minute to thousands of gallons per minute.

Ideally, the wastewater is treated locally, or at the contamination site. In the present case the contamination site is at the burn/wet scrubber 26. A semiconductor manufacturing plant will have a number of CVD reactors, and each reach reactor is preferably equipped with the abatement system 19, including the wet/burn scrubber 26 and the water treatment unit 27 as disclosed herein.

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. A treatment system for the treatment of effluent gases from a semiconductor device manufacturing process, the treatment system comprising:

(a) an abatement system comprising:
       i) a burn/wet scrubber for receiving a flow of effluent gas containing a toxic constituent and for producing a flow of treated gas and a flow of wastewater containing the toxic constituent; and
       ii) a localized wastewater treatment unit comprising an ion exchange filter selected to reduce the concentration of said toxic constituent, for receiving said flow of wastewater containing the toxic constituent, and for producing a flow of locally treated wastewater from which the toxic constituent has been abated.

2. The treatment system of claim 1 further comprising a plurality of burn/wet scrubbers in fluid communication with said localized wastewater treatment unit.

3. The treatment system of claim 1 additionally comprising a central wastewater treatment facility for receiving and further treating the locally treated wastewater.

4. The treatment system of claim 3 further comprising a plurality of burn/wet scrubbers and a plurality of localized wastewater treatment units wherein each said burn/wet scrubbers is in fluid communication with a localized wastewater treatment unit, and each said localized wastewater treatment unit is in fluid communication with the central wastewater treatment facility.

5. The treatment system of claim 1 wherein said ion exchange filter is selected to reduce the concentration of arsenic and germanium.

6. The treatment system of claim 1 wherein said ion exchange filter is selected to reduce the concentration of the toxic constituent to a concentration below 50 ppb.

* * * * *